US011037798B2

(12) United States Patent
Lane et al.

(10) Patent No.: US 11,037,798 B2
(45) Date of Patent: Jun. 15, 2021

(54) SELF-LIMITING CYCLIC ETCH METHOD FOR CARBON-BASED FILMS

(71) Applicant: Tokyo Electron Limited, Tokyo (JP)

(72) Inventors: Barton G. Lane, Austin, TX (US); Nasim Eibagi, Cibolo, TX (US); Alok Ranjan, Austin, TX (US); Peter L. G. Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/807,330

(22) Filed: Nov. 8, 2017

(65) Prior Publication Data

US 2018/0130669 A1 May 10, 2018

Related U.S. Application Data

(60) Provisional application No. 62/419,844, filed on Nov. 9, 2016.

(51) Int. Cl.
*H01L 21/311* (2006.01)
*H01L 21/02* (2006.01)
*H01L 21/027* (2006.01)
*H01L 21/66* (2006.01)

(52) U.S. Cl.
CPC .... *H01L 21/31138* (2013.01); *H01L 21/0276* (2013.01); *H01L 21/02321* (2013.01); *H01L 21/31144* (2013.01); *H01L 22/12* (2013.01)

(58) Field of Classification Search
CPC ................. C08F 212/14; C08F 212/32; C08F 2220/281; C08F 2220/282; C08F 2220/283; H01L 21/0228; H01L 21/02274; H01L 21/31116; H01L 21/02164; H01L 21/0217
See application file for complete search history.

(56) References Cited

U.S. PATENT DOCUMENTS

| 2003/0100190 A1* | 5/2003 | Cote ................. H01L 21/76808 438/710 |
| 2004/0251077 A1 | 12/2004 | Wright et al. |
| 2006/0240589 A1 | 10/2006 | Nagata |
| 2007/0269721 A1 | 11/2007 | Kim et al. |
| 2011/0195577 A1 | 8/2011 | Kushibiki et al. |

OTHER PUBLICATIONS

International Search Report and Written Opinion of the International Searching Authority dated Jan. 23, 2018 in PCT/US17/60782.
Notification of Examination Opinions dated Feb. 18, 2021 issued in corresponding Taiwanese patent application No. 106138528 (with English translation).

* cited by examiner

*Primary Examiner* — Tony Tran
(74) *Attorney, Agent, or Firm* — Oblon, McClelland, Maier & Neustadt, L.L.P.

(57) ABSTRACT

Embodiments of the disclosure describe a cyclic etch method for carbon-based films. According to one embodiment, the method includes providing a substrate containing the carbon-based film, exposing the carbon-based film to an oxidizing plasma thereby forming an oxidized layer on the carbon-based film, thereafter, exposing the oxidized layer to a non-oxidizing inert gas plasma thereby removing the oxidized layer and forming a carbonized surface layer on the carbon-based film, and repeating the exposing steps at least once.

22 Claims, 11 Drawing Sheets

SELF-LIMITING CYCLIC ETCH METHOD FOR CARBON-BASED FILMS

CROSS REFERENCE TO RELATED APPLICATIONS

The present application claims the benefit of U.S. provisional patent application No. 62/419,844, filed on Nov. 9, 2016, which is incorporated herein by reference in its entirety.

FIELD OF THE DISCLOSURE

The present disclosure generally relates to etching of films used in semiconductor devices, and more particularly relates to a cyclic etch method for carbon-based films.

BACKGROUND

Carbon-based films are used extensively in the semiconductor industry as masks to pattern underlying layers. The initial patterning of any layer usually begins with lithographically defining a pattern in a photoresist which is typically a hydrocarbon polymer or a hydrocarbon macromolecule. This pattern is then successively transferred to films which contain Si and to other hydrocarbon polymer or amorphous hydrogenated carbon films which eventually act as masks for etching the final films which may be insulators, such as $SiO_2$, or conductors such as doped Si.

The yield in a semiconductor device manufacturing depends on the control of critical dimensions (CD) both globally across the wafer and locally over feature size scales; an example of a critical dimension is the width of a line which is to be etched. The first type of CD is often termed global CD uniformity (CDU) and results from factors like uneven distribution of neutral active species and/or uneven distribution of plasma ions and electrons. The second type of CD often depends on details of the pattern layout on the wafer, whether the features are nested or isolated, and whether the recessed features (i.e., trenches) are wide or narrow. Control of these different uniformities is problematic in conventional continuous and pulsed plasma processes because of the many trade-offs associated with the plasma species and energy delivered to the features with respect to etch rate, profile control, and the uniformities. By way of example, oxygen plasma radicals from oxygen-rich plasmas provide high etch rates but lead to CD loss.

SUMMARY

In view of the foregoing, it is an objective of the present disclosure to provide a method for attaining good global and local uniformity in etched carbon-based films. These and/or other objectives may be provided by the following aspects of the disclosure.

A first aspect of the disclosure relates to a cyclic etch method for etching a carbon-based film, the method includes: (i) providing a substrate comprising the carbon-based film; (ii) exposing the carbon-based film to a first process gas thereby forming an activated layer on the carbon-based film; (iii) exposing the activated layer to a second process gas comprising a plasma thereby removing the activated layer and forming a carbonized layer on the carbon-based film, wherein the plasma is a non-activating inert gas; and (iv) repeating the exposure of the carbon-based film to the first process gas and the second process gas at least once.

In one embodiment, wherein the first process gas includes a first plasma formed by plasma-exciting a process gas consisting of $O_2$ gas.

In one embodiment, the first process gas includes a first plasma formed by plasma-exciting a process gas consisting of $O_2$ gas and an inert gas.

In one embodiment, the first process gas includes a first plasma formed by plasma-exciting a process gas comprising $O_2$ gas and Ar gas.

In one embodiment, the second process gas includes a second plasma formed by plasma-exciting a process gas consisting of Ar gas.

In one embodiment, the carbon-based film comprises at least one of a hydrocarbon polymer and an amorphous hydrogenated carbon.

In one embodiment, the carbon-based film comprises carbon and hydrogen, and the carbonized layer is at least substantially free of hydrogen.

In one embodiment, a patterned mask layer overlies the carbon-based film.

In one embodiment, the patterned mask layer includes: (i) an anti-reflective coating comprising silicon, wherein the anti-reflective coating is on the carbon-based film; and (ii) a photoresist layer on the anti-reflective coating.

In one embodiment, the formation of the activated layer and the formation of the carbonized layer are self-limiting processes.

In one embodiment, the carbon-based film comprises carbon and hydrogen, the method further includes monitoring light emission from by-products released from the carbon-based film to determine properties of the carbonized layer, the activated layer, or both the carbonized layer and the activated layer.

In one embodiment, the properties of the carbonized layer include a thickness of the carbonized layer.

In one embodiment, the properties of the activated layer include a thickness of the activated layer.

In one embodiment, the method further includes exposing the activated layer to a silylating agent thereby adding silicon to the activated layer.

In one embodiment, the silylating agent includes hexamethyldisilazane.

In one embodiment, the method further includes exposing the carbonized surface layer to a silylating agent thereby adding silicon to the carbonized surface layer.

In one embodiment, the silylating agent comprises hexamethyldisilazane.

In one embodiment, the method further includes exposing the carbon-based film to a continuous plasma to remove the carbon-based film by a non-self-limiting process, where the continuous plasma is formed by plasma-exciting a process gas comprising $O_2$ gas and Ar gas.

In one embodiment, the method further includes varying relative amounts of $O_2$ and Ar gas in the continuous plasma.

A second aspect of the disclosure relates to a cyclic etch method for etching a carbon-based film, the method including: (i) providing a substrate containing the carbon-based film, wherein a patterned mask layer overlies the carbon-based film; (ii) etching recessed features in the carbon-based film by: (A) exposing the carbon-based film to a first plasma thereby forming an activated layer on the carbon-based film in the recessed features; (B) exposing the activated layer to a silylating agent thereby adding silicon to the activated layer; thereafter, (C) exposing the activated layer to a second plasma thereby removing the activated layer and forming a carbonized surface layer on the carbon-based film; and (D) repeating the exposing steps at least once.

BRIEF DESCRIPTION OF THE DRAWINGS

The accompanying drawings, which are incorporated in and constitute a part of this disclosure, illustrate embodiments of the disclosure and, together with a general description of the disclosure given above, and the detailed description given below, serve to explain the disclosure.

In FIG. 7, the coupon labeled "mid" is approximately in the center of the plasma chamber and the coupon labeled "top" is near the wall of the plasma chamber.

DETAILED DESCRIPTION OF SEVERAL EMBODIMENTS

Figure 1:
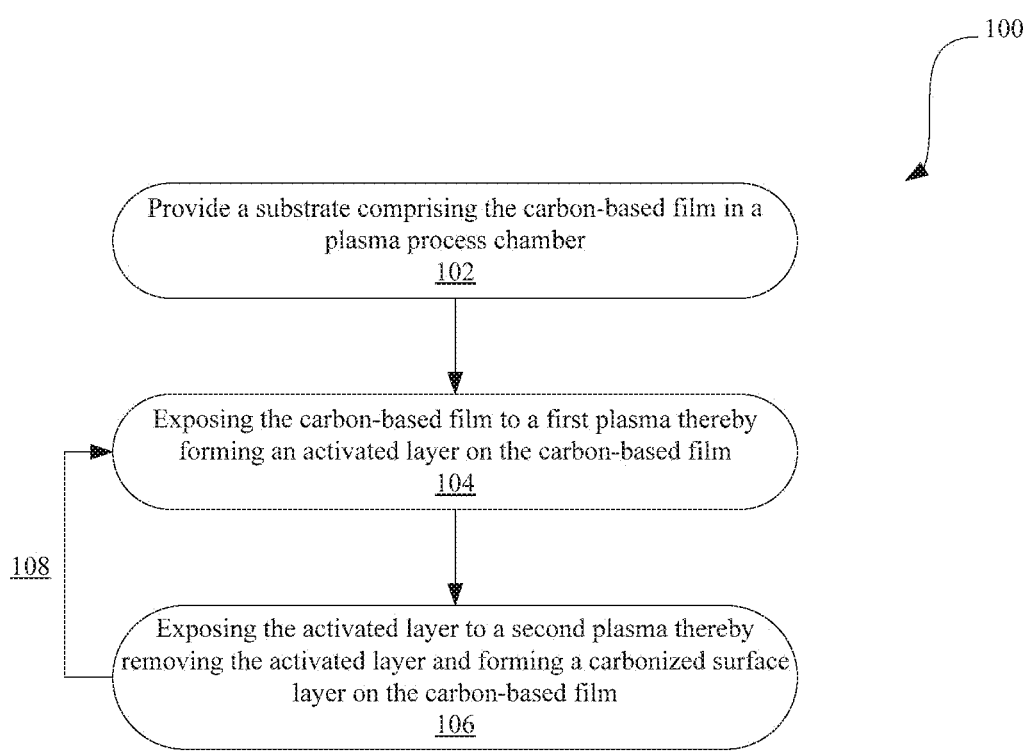
FIG. 1 is a flow diagram for an embodiment of the cyclic etch method for exposing the substrate to a first plasma and a second plasma.

The following detailed description refers to accompanying drawings to illustrate exemplary embodiments consistent with the present disclosure. References in the detailed description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment.

The exemplary embodiments described herein are provided for illustrative purposes, and are not limiting. Other embodiments are possible, and modifications can be made to exemplary embodiments within the scope of the present disclosure. Therefore, the detailed description is not meant to limit the present disclosure. Rather, the scope of the present disclosure is defined only in accordance with the following claims and their equivalents.

The following detailed description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the presentation is to be interpreted by those skilled in relevant art(s) in light of the teachings herein.

Embodiments of the disclosure describe a method for attaining good global and local uniformities through the use of a series of self-limiting processes. Self-limiting processes provide a solution to the problem of trade-offs in plasma etching processes, including feature profile, etch rate, selectivity, global and feature dependent uniformity. For example, the series of self-limiting processes can include one process step that activates the surface of a substrate to form an activated layer, and then another process step that volatilizes the activated layer. Each process step is separately self-limiting. Also, the volatilization only releases activated species from the activated layer and not non-activated species. The use of self-limiting processes for organic materials, such as carbon-based films, according to embodiments of the disclosure provides a much needed solution.

"Substrate" as used herein generically refers to the object being processed in accordance with the embodiments described herein. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The substrate may comprise a carbon-based film, aluminum, chromium, copper, gallium, germanium, indium, silicon, titanium, tungsten, arsenic, phosphorous, and combinations thereof. The substrate may contain, for example, up to 40 wt %, 50 wt %, 60 wt %, 70 wt %, 80 wt %, 90 wt %, or 100 wt % of the carbon-based film, based on a total weight of the substrate. The carbon-based film may be amorphous, semi-crystalline, or crystalline. The carbon-based film may contain, for example, at least 50 at %, 60 at %, 70 at %, 80 at %, 90 at %, 95 at % of carbon, based on a total atomic content of the carbon-based film. Examples of carbon-based films include, without limitation, hydrocarbon polymers, hydrogenated amorphous carbon, highly oriented pyrolytic graphite, fullerenes (e.g., bucky balls, carbon nanotubes), and combinations thereof. The hydrocarbon polymer may be a polyolefin (e.g., polyethylene, a polypropylene, a polybutylene, a polyisobutylene, a poly(4-methyl-1-pentene) (PMP)), polystyrene, poly(α-methylstyrene), or copolymers thereof. Exemplary polyethylene polymers include, without limitation, ultrahigh molecular weight polyethylene (UHMWPE), high density polyethylene (HDPE), medium density polyethylene (MDPE), low density polyethylene (LDPE), linear low density polyethylene (LLDPE), branched low density polyethylene (BLDPE), and ultralow density polyethylene (ULDPE). Exemplary polypropylene polymers include, without limitation, ultrahigh molecular weight polypropylene (UHMWPP), isotactic polypropylene (iPP), syndiotactic polypropylene (sPP), nucleated polypropylene, nucleated ultrahigh molecular weight polypropylene, high-crystalline polypropylene (HCPP), and high melt-strength polypropylene (HMS-PP). The hydrocarbon polymer may be linear, branched, or cross-linked. In some embodiments where the hydrocarbon polymer is cross-linked, the polymer strands are linked by an ether (C—O—C) group. The hydrogenated amorphous carbon may have a $sp^3$ hybridization level of, for example, not more than 70%, 60%, 50%, or 40%, based on a total number of carbons. The carbon-based film may be deposited as a thin layer (e.g., 50-300 nm, or 100-200 nm) by an appropriate deposition technique, such as plasma-enhanced chemical vapour deposition (PECVD), or physical vapour deposition (PVD) (e.g., by ion-beam spraying (IBS) of a carbon target), or spin coating.

In some embodiments, a patterned mask layer overlies the carbon-based film. The patterned mask layer may include an anti-reflective coating (ARC) layer, which is in contact with the carbon-based film, and a photoresist layer on the ARC layer. The patterned mask layer exposes portions of the carbon-based film to the plasma treatments which may have no impact on the patterned mask layer. In some embodiments, there may be a small amount of deposition or etching of the patterned mask layer which may not impact the treatment by the first and second plasma on the carbon-based film. Preferably, the patterned mask layer may have a high etch selectivity compared to the underlying substrate. The ARC layer may contain titanium dioxide, silicon nitride, silicon dioxide, and combinations thereof. Preferably, the ARC contains silicon (e.g., SiARC) in the form of silicon nitride, silicon dioxide, or combinations thereof. The ARC layer may also be a siloxane or other silicon containing polymer or macromolecule.

In some embodiments, the substrate may include a patterned surface which may or may not include different film types that may be exposed to plasma. The combination of film types may have different selectivity with respect to the removal process, such that one film type may have a much higher oxidation rate during activation step and a much higher etch rate during the volatilization. In this way, portions of the substrate may be targeted for monolayer(s) removal, while other exposed layers may not be substantially altered by the removal process. Structures formed during microelectronic device manufacturing may include many combinations of structures that may protrude into or out of the substrate. The portions may include trenches into the substrate, film stacks, blocks, or fins that may protrude from the substrate, or a combination thereof. The structures (e.g., film stacks, fins) may also include different film layers that may or may not have different thicknesses.

The plasma composition and characteristics is described in greater detail in the description of FIG. 1. FIG. 1 illustrates an embodiment 100 of the disclosed cyclic etch method for removing surface layers of a substrate by alternating exposure between a first plasma and a second plasma. The number of cycles is in a range of 10 to 120 cycles, although the method may still function as intended with fewer or more cycles.

At block 102, a substrate including a carbon-based film is provided in a plasma process chamber.

At block 104, the carbon-based film is exposed to a first plasma to form an activated layer on the carbon based film. As noted above, the purpose of the first step is to activate the surface of a substrate to form an activated layer that can be subsequently volatilized. In the embodiment of FIG. 1, block 104, activation is performed with a plasma containing a reactive species-oxygen so the hydrocarbon film was exposed to both a flux of ions and radicals. However, activation may be done using just a radical source without activating a plasma. The first plasma of block 104 may be generated by plasma-exciting a process gas in a plasma reactor. In the context of the disclosure, the term "plasma-exciting" refers to applying an energy source (e.g., microwave or RF (e.g., ICP, CCP)) to the process gas thereby forming the plasma. The process conditions for forming the activated layer on the substrate include, but are not limited to, reactor pressure, power, process gas composition, concentration, and exposure time. As used herein, the term "exposure time" refers to the duration for which the substrate is exposed to the process gas and/or plasma in a step in the cycle. For example, the exposure time may be in a range of 0.5-10 s, 1-5 s, or any range in between. For exposure times below 0.5 s, the plasma characteristics may become inconsistent among the cycles. Exposure times longer than 10 s may lead to process times for the disclosed method being too long to be economically feasible for production.

For a method with 10 cycles with 2 steps in each cycle and an exposure time of 1 s, the total exposure time is 20 s. The term "total exposure time" refers to the sum of exposure time of each step in a cycle multiplied by the number of cycles. The reactor pressure may, for example be between 5-1,000 mTorr, 10-500 mTorr, or preferably between 20-200 mTorr. In some embodiments where the energy source is microwave, a power between 500-10.000 W, or 1,000-3,000 W may be applied at a driving frequency between 300 MHz to 10 GHz, or about 2.45 GHz to a source electrode disposed in the plasma reactor. In some embodiments where the energy source is radiofrequency, a power between 1-300 W, 5-100 W, 10-50 W or about 15 W may be applied. A frequency of the radiofrequency may be in a range of 10-30 MHz, 12-15 MHz, or 13-14 MHz. In some embodiments, the method can still function as intended when the method is scaled to very high frequency (VHF) which is in a range of 30-300 MHz, or 100-300 MHz.

In some embodiments, the mechanism of the activation step is a combination of physical and chemical etching. The process gas contains one or more activating gases (such as an oxygen-containing gas, a nitrogen-containing gas, a halogen-containing gas, or combinations thereof) and optionally one or more dilution gases. In embodiments where there is an overlying patterned silicon mask on the carbon-based film, the activating gas may or may not include a fluorine-containing gas (e.g., $CF_4$, $C_4F_6$, or $C_4F_8$). In some embodiments, the activating gas does not include a fluorine-containing gas because the resulting plasma may etch the overlying patterned silicon mask layer and thus is not selective in etching the carbon-based film. In some embodiments, where the overlying mask layer etches slower than the carbon-based film in the presence of fluorine-containing plasma, the activating gas may include fluorine-containing gas. In some embodiments, the process gas is 100% of an oxygen-containing gas such as $O_2$ gas. In some embodiments, the process gas contains a dilution gas which may include a chemically inert species (preferably noble gases such as Ar gas, He gas, Ne gas, and Kr gas) relative to the activating gas or materials within the plasma reactor. In some embodiments, the process gas contains or consists of $O_2$ gas and Ar gas. The $O_2$/Ar mixture may be lean and contain, for example, up to 10 vol %, 8 vol %, 5 vol %, 3 vol %, preferably not more than 1 vol % of $O_2$, or more preferably not more than 0.7 vol % of $O_2$, based on the total volume of the process gas. As noted above, in some embodiments the surface is exposed to both ions and oxygen at the same time such that oxidizing and volitalizing occur at the same time. In these embodiments, as the surface is exposed to both ions and oxygen radicals, the oxidizing and volatilizing of the surface of the carbon-based film occur simultaneously. If the exposure time is too long the top layer which is carbon rich is etched away and the process reverts to a CW etching process without the benefit of self-limiting steps. In some embodiments, the $O_2$/Ar mixture may be rich and contain, for example, more than 20 vol %, 25 vol %, 30 vol %, or 40 vol % $O_2$, based on the total volume of the process gas. In these embodiments, the exposure time may be shorter than the exposure time when a lean $O_2$/Ar mixture is used. In other embodiments, the $O_2$/Ar mixture may contain between about 10 vol % and about 20 vol % $O_2$, based on the total volume of the process gas. In some embodiments, the first plasma may be an oxidizing plasma, which contains $O_2$ gas as the activating gas, and the activated layer formed after the carbon-based film is exposed to the oxidizing plasma is referred to as an oxidized layer.

The activated layer may be formed by deposition, oxidation, and/or passivation mechanisms. In the context of the disclosure, the term "activated layer" refers to surface of the carbon-based film containing adsorbed/deposited activating radicals/ions and/or reaction products between the carbon-based film and the activating radicals/ions. For example, when the first plasma contains oxygen, nitrogen, and/or halogen, the activated layer may contain oxygen (in the form of $O_2$ and/or —OH), nitrogen (in the form of $N_2$ and/or —$NH_2$), and/or halogen (in the form of $X_2$ and/or C—X where X is F, Cl, or Br), respectively. The activated layer may be saturated with oxygen, nitrogen, and/or halogen. The adsorption of the activating radicals/ions may be limited to a few monolayers, or even a single monolayer. The activation of the surface of the substrate may be self-limiting (i.e., the surface activation cannot proceed indefinitely) because the activated species on the surface of the substrate block the activating species (e.g., plasma radicals/ions) from penetrating deep into the substrate or to deeper layers and/or because the activating species are extinguished before they penetrate too deeply into the substrate. In short, the thickness of the activated layer may be limited to the how far the plasma ions/radicals can diffuse into the carbon-based film. A thickness of the activated layer may range from 0.1-20 nm, 0.5-15 nm, or 1-10 nm, for example. The thickness of the activated layer may be determined or measured by the optical emission spectroscopy (OES) emulation of secondary ion mass spectroscopy (SIMS) method (OES-"SIMS"), scanning electron microscopy, and transmission electron microscopy. Thus, in addition to the difference in chemical properties/composition, the activated layer may have different physical properties that may be distinguishable from the underlying substrate (e.g., differences in etch rate under certain plasma conditions).

One or more gas purges may be implemented between the first plasma and the second plasma, but are not required. Preferably, a gas purge is implemented between the first plasma and the second plasma so that the activating species are not present in the plasma reactor when the substrate is exposed to the second plasma. In one embodiment, purging the process gas between the activation and volatilization steps may include applying a continuous vacuum (i.e., no process gas being flowed into the plasma reactor). In other embodiments, the process gas may be purged by flowing the dilution gas and achieving a reactor pressure that may be less than the plasma process pressure. In embodiments where purging is implemented, the purge time may be measured from the extinguishing of the first plasma and to the initiation of the second plasma. The purge time may, for example, range from 0.5-10 s, 1-8 s, or 3-6 s.

At block 106, the activated layer is exposed to a second plasma thereby removing the activated layer and forming a carbonized layer. In one embodiment the feed gas for the second plasma consists only of a noble gas such as Argon. The carbonized layer is structurally similar to graphite and is at least substantially free of light atoms such as hydrogen. In the context of the disclosure, the carbonized layer is said to be substantially free of light atoms when the production of the etch by-products containing the light atoms are no longer observed by the OES-"SIMS" method, which will be described further below. A thickness of the carbonized layer may range from 1-50 nm or preferably 1-10 nm. The volatilization process is self-limiting due to the etch selectivity between the activated layer and the underlying carbon based film. That is, the carbon-rich layer is etched at a very low rate by noble gas ions in comparison to the etch rate of an activated layer since such ions impart momentum and energy to the surface leading to physical sputtering rather than to chemical reactions In preferred embodiments, the process gas contains 100% Ar gas. Although the disclosed method can still function as intended when the process gas contains Ar gas and/or other noble gases.

The microwave/RF power, pressure, and/or substrate temperature may be varied to achieve a desired etch rate. For example, the process gas may be exposed to a microwave energy between 1,000 W and 3,000 W or RF energy between 10 W and 200 W while the pressure may be maintained between 5 mTorr and 1,000 mTorr. The exposure time to the second plasma may be in a range of 0.5-10 s and any range in between for the reasons described above. In some embodiments, the exposure time to the second plasma may be 1.1-5 times, 1.5-4 times, or 2-3 times longer than the exposure time to the first plasma.

The frequency of the applied energy source may be different between the first and second plasmas, so that the first and second plasma have different plasma characteristics (e.g., radical flux, ion flux, radical-to-ion flux ratio, ion energy, etc.) to achieve the desired result on the substrate. For example, the frequency of the energy source for the first plasma may be higher than the frequency of the energy source for the second plasma in order to generate a high density first plasma. Further, selective removal of the substrate may occur when the second plasma has a different radical content and/or ion energy than the first plasma. For example, the second plasma may have mostly ions and little to no radicals, and high ion energy relative to the first plasma. However, the ion energy of the second plasma may be bounded by a sputter threshold that prevents damaging the substrate or the plasma reactor.

Following the removal of the activated portion of the substrate and carbonizing by removal of hydrogen from the hydrocarbon, the process may return back (in block 108) to the first plasma which treats newly exposed carbonized portions or surface of the substrate. A subsequent first plasma exposure step infuses the carbonized layer with activating species. The infusion rate of the activating species may be limited because the carbonized layer is dense and thus may hinder diffusion. As a result, activating species may extinguish before they travel deep into the carbon-based film. A fresh activated layer is thus once again ready for removal by the second plasma.

In the alternating plasma treatments, the subsequent activation or volatilization process conditions may be different from the previous implementations of the activation or the volatilization process. For example, the exposure time to the plasma treatments may be increased/decreased during subsequent treatments. In other embodiments, the change from the first and second plasma may be done in a symmetrical manner, such that the exposure times are the same or similar. In certain embodiments, the change from the second and first plasma may occur in an asymmetrical manner, such that the substrate may be exposed to the first plasma and the second plasma for different times. Changes in process conditions may correlate to a physical parameter such as etch depth. The activating/volatilizing process may be repeated until the desired trench structure is formed.

In preferred embodiments, the etching of carbon-based films employs an oxygen-based chemistry because carbon monoxide (CO) is a major etch by-product and CO is an unreactive volatile species that leaves the etching system without redepositing on other surfaces. Conventional etch processes of carbon-based films have been continuous (termed CW); that is, the plasma and oxygen species are both created simultaneously and are in steady state for the duration of the etch step which may last from 10 to 60 sec. If the plasma and the oxygen species are perfectly uniform above the wafer, then this typically leads to at least global uniformity across the entire wafer. This is because in steady state the etch process cannot be self-limiting and thus depends on the fluxes of ions and radicals. Unfortunately, the ideal situation of perfectly uniform plasma and oxygen species across the wafer is rarely achieved in practice to the degree required for next generation semiconductor devices. Further, the problems of local non-uniformity (e.g., edge structures, iso-dense bias, and aspect ratio dependent etch (ARDE)) are not solved by simply making the plasma uniform. Embodiments of the disclosure can reduce or solve these problems by employing a set of cyclic, self-limiting steps to the process of carbon-based etching using an oxygen-based chemistry. The experimental data shows great reduction in global and local non-uniformities with this cyclic etch method. One embodiment of the disclosed method uses alternating oxygen and argon plasma exposures to create a self-limiting etching process that resembles atomic layer etching (ALE).

The global vertical etch rate non-uniformity and/or an ARDE of a carbon-based film etched using a continuous wave plasma only may be between 10-50%, 15-40%, or 20-30%, for example. The global vertical etch rate non-uniformity and/or an ARDE of a carbon-based film etched using the cyclic etch method disclosed herein may be, for example, between 1-5%, 1.5-4%, or 2-3%. In some embodiments, the global vertical etch rate non-uniformity and/or an ARDE of a carbon-based film etched using the cyclic etch method disclosed herein may be 0.5-3 magnitudes, 0.8-2 magnitudes, or about 1 magnitude smaller than the corresponding values for a carbon-based film etched using a continuous wave method. The global vertical etch rate non-uniformity may be calculated using the maximum and minimum depths of similar aspect ratio etch features (for example dense i.e., nested features) at different locations of the plasma reactor. For example, as shown in FIG. 8, a first sample coupon is placed near the edge (labeled "top") of the plasma reactor while a second sample coupon is placed near the middle section (labeled "mid") of the plasma reactor. The global vertical etch rate non-uniformity may be calculated with equation (1):

$$\text{Global vertical etch rate non-uniformity} = \frac{2\,(\text{max depth} - \text{min depth})}{\text{max depth} + \text{min depth}} \times 100\% \tag{1}$$

The ARDE may be calculated using the same equation (1) for etch depths of different aspect ratio etch features (for example nested and isolated lines) at a same location (e.g., in FIG. 8, within the same coupon).

Figure 2:
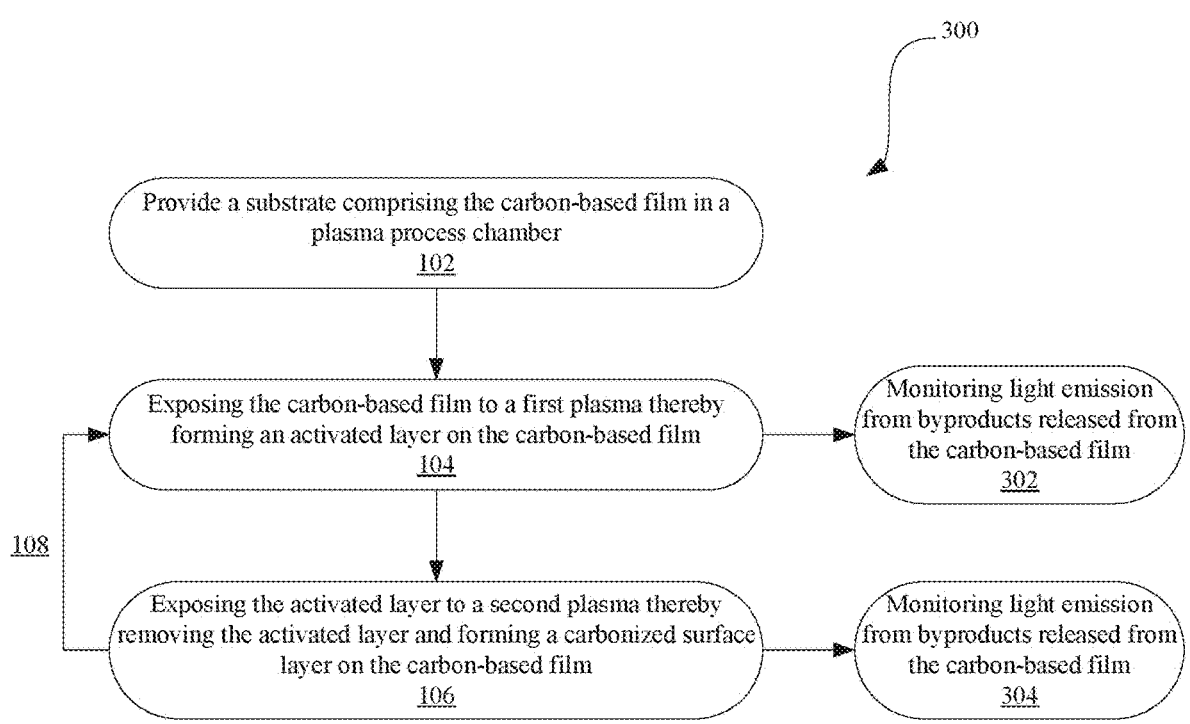
FIG. 2 is a flow diagram for an embodiment of the cyclic etch method which includes monitoring the etch by-products with optical emission spectroscopy (OES) emulation of secondary ion mass spectroscopy (SIMS) (i.e., OES-"SIMS").

FIG. 2 shows an embodiment 300 of the cyclic etch method which includes detecting the etch by-products with the OES emulation of SIMS in blocks 302 and 304. In some embodiments, the etch by-products may be detected during the activating step 104, the volatilizing step 106, or during both.

Optical emission spectroscopy (OES) has proven itself as a useful tool for process development and monitoring in plasma processing. In optical emission spectroscopy, the presence and concentrations of certain chemical species of particular interest, such as radicals, is deduced from acquired optical (i.e. light) emission spectra of the plasma, where the intensities of certain spectral lines and ratios thereof correlate to the concentrations of chemical species. A detailed description of the technique can be found in e.g. G. Selwyn, "Optical Diagnostic Techniques for Plasma Processing", AVS Press, 1993, which is incorporated herein in its entirety and will not be repeated here, for brevity. The use of optical emission spectroscopy has become relatively commonplace, particularly in plasma process development, and it is done by acquiring optical emission spectra from a volume within the plasma, inside the plasma reactor. Optical emission spectroscopy alone does not yield information about the thickness of the activated or carbonized surface.

Conventional SIMS is a technique used to analyze the composition of solid surfaces and thin films by sputtering the surface of the specimen with a focused primary ion beam (e.g., Ar ions) and collecting and analyzing ejected secondary ions. The mass/charge ratios of these secondary ions are measured with a mass spectrometer to determine the elemental, isotopic, or molecular composition of the surface to a depth of 1 to 2 nm.

The thickness of the activated/carbonized layer may be measured with an OES emulation of the SIMS method (i.e., OES-"SIMS") in which the optical emission of the secondary ions are detected instead of the mass/charge ratios of the secondary ions. In the OES-"SIMS" method, OES signals from selected etch by-products in the gas phase are indicators of etch rate during the plasma processing. In one embodiment, when the first plasma is formed from plasma-exciting oxygen gas, OES signals of $H_\gamma$, $H_\beta$, and $H_\alpha$ may be monitored because these species are not present in the plasma and thus come from the surface of the carbon-based film. In another embodiment where the second plasma consists of Ar ions and radicals, OES signals of OH, $H_\gamma$, $H_\beta$, and $H_\alpha$, may be monitored. In one non-limiting embodiment, an OES signal at 656 nm ($H_\alpha$) from hydrogen released from a carbon-based film during the volatilization step may be monitored and analyzed. Once calibrated using a material with a known etch rate, the OES signals provide sub-nm etch depth information and sub-layer (densified layer) characterization. The etch progress can be correlated to the OES signal. This enables in-line real-time metrology for the alternating cyclical plasma exposure steps described herein. In one embodiment, the metrology is calibrated on a standard test wafer and OES signals are sent to a software-based control system used to adjust cycle times and gas chemistries.

In addition to the embodiments described above, the cyclic etch method may include other chemistries and/or process sequences that enable selective removal of a monolayer(s) from the substrate. For example, in an embodiment where the process gas for the first plasma contains $O_2$, a sufficient amount of oxidation is required in order to create a saturated oxidation layer in order to obtain an etch process which is globally and locally uniform. However, such a high degree of oxygen saturation usually leads to sidewall erosion, which leads to the bowing of lines such that their middle is narrower than their top or bottom. This may be remedied by the addition of a deposition step and/or a passivation step. In one embodiment, the deposition step can be a self-limiting atomic layer deposition (ALD) step which would be conformal. This would continue the global and the local uniformity of the cyclic etch process.

Figure 3:
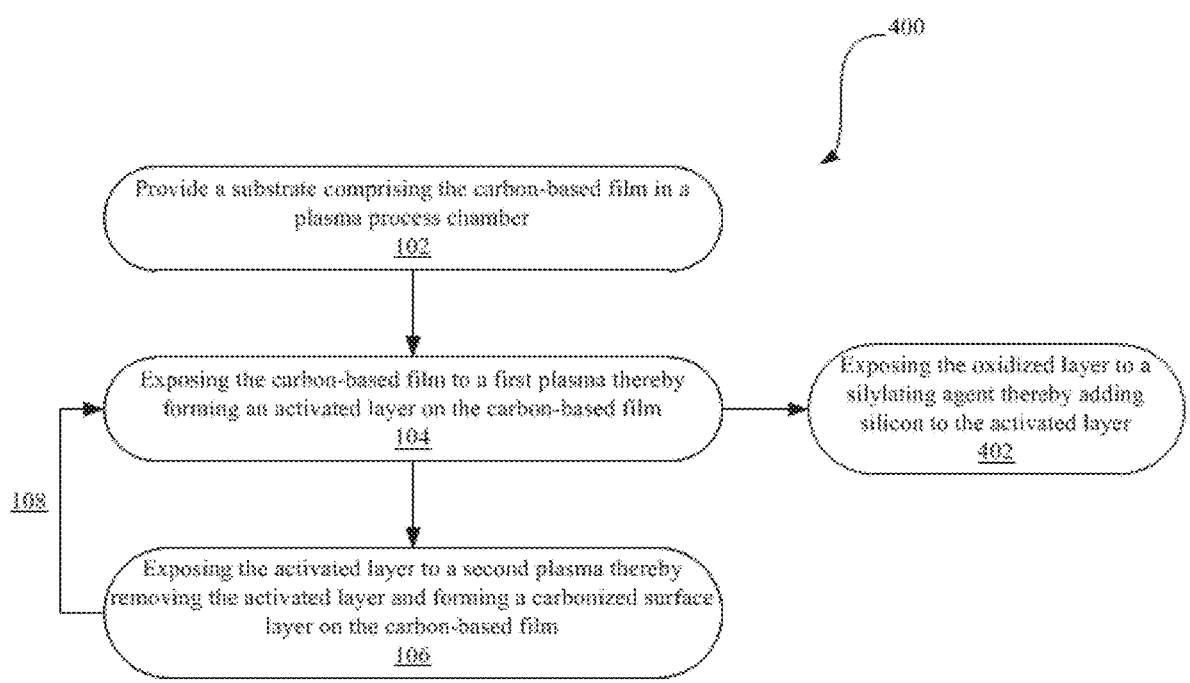
FIG. 3 is a flow diagram for an embodiment of the cyclic etch method which includes exposing the substrate to a silylating agent after the exposure to the first plasma.

FIG. 3 illustrates an embodiment 400 of the cyclic etch method including the additional step in block 402 taking place after the activated layer is formed. The additional step could employ a silylating agent which does not bind to itself but binds to the activated moieties (e.g., hydroxyl groups and/or amino groups) remaining on the surface of the substrate after the activation step. Exemplary silylating agents include, without limitation, $Me_3SiCl$ (KA-31), $Me_3SiNHSiMe_3$ (hexamethyldisilazane, HMDS), $Me_3SiNHCONHSiMe_3$ (BTSU), $Me_3SiOC(CF_3)=NSiMe_3$ (BSTFA), $Me_3SiOSO_2CF_3$ (TMST), $Et_3SiCl$ (TESC), i-$Bu_3SiCl$ (TIBSC), tert-$BuMe_2SiCl$ (TBMS), i-$Pr_3SiCl$ (TIPSC), $Cl(i-Pr)_2SiOSi(i-Pr)_2Cl$ (TDSC), $TxMe_2SiCl$ (Tx is thexyl). Preferably, the silylating agent is HMDS. The substrate may be exposed to a gaseous stream of silylating agent which may contain, for example, up to 60 vol %, 70 vol %, 80 vol %, 90 vol %, or 100 vol % of the silylating agent, based on a total volume of the gas. The gaseous stream may contain one or more gases which are inert to the silylating agent under the silylation conditions. Such gases may include noble gases as set forth above, nitrogen, and combinations thereof. The plasma reactor pressure may be between 100-500 mTorr, or 150-300 mTorr. The exposure time to the silylating agent may be between 1-30 s to allow the activated layer or carbonized layer to react with the silylating agent. Preferably, the exposure time to the silylating agent is not longer than 30 s because the process then becomes too slow to be economical. After the layer is silylated, the coupon may be subjected to another first plasma. Under the process conditions of the first plasma, the silyl groups may be converted to silica (e.g., quartz) which protects the surface from further etching by the activating species.

Figure 4:
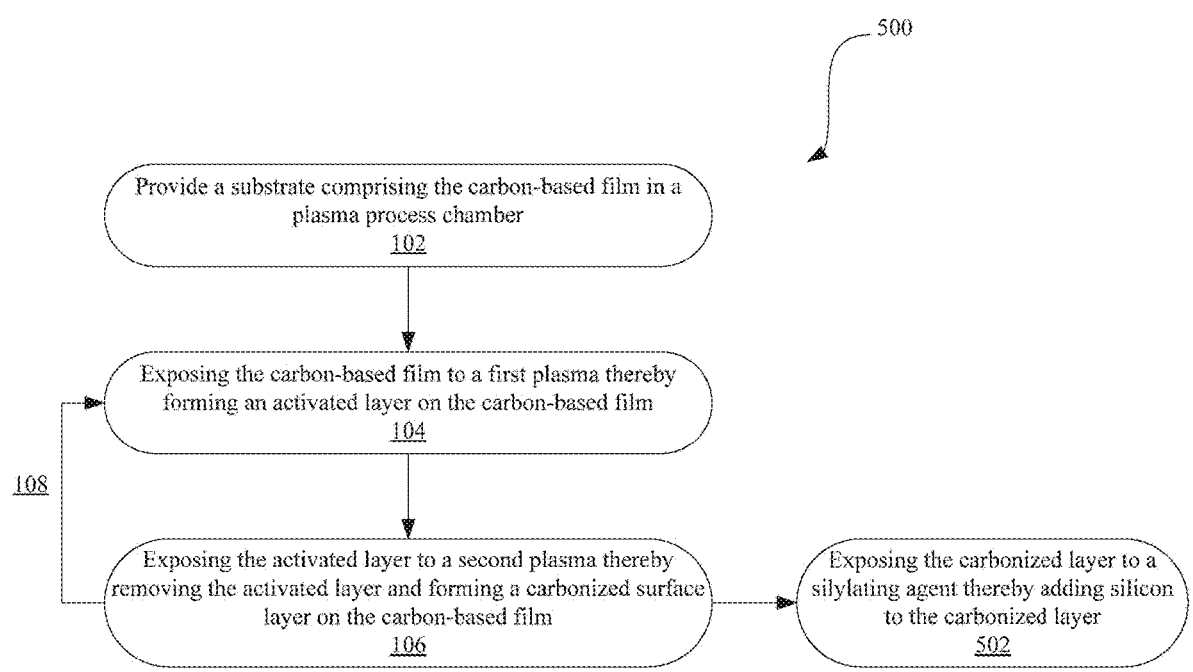
FIG. 4 is a flow diagram for an embodiment of the cyclic etch method which includes exposing the substrate to a silylating agent after the exposure to the second plasma.

FIG. 4 illustrates an embodiment 500 of the cyclic etch method including the additional step in block 502 taking place after the carbonized layer is formed. This approach exploits the fact that the sidewall surfaces in a patterned substrate receive less ion bombardment than the feature bottom surfaces so that at the end of the volatilizing the two surfaces differ. For example, the surfaces of the sidewalls may contain more activated moieties than the feature bottom, which may resemble graphite. It is therefore possible to use molecules, such as the silylating agents described herein, which selectively bond to the sidewalls rather than to the feature bottom. Preferably, the silylating agent is HMDS which is not strongly reactive to graphite but is very reactive to hydroxyl groups. Incorporating silicon into the sidewalls may passivate the sidewall etching by activating species.

Figure 5:
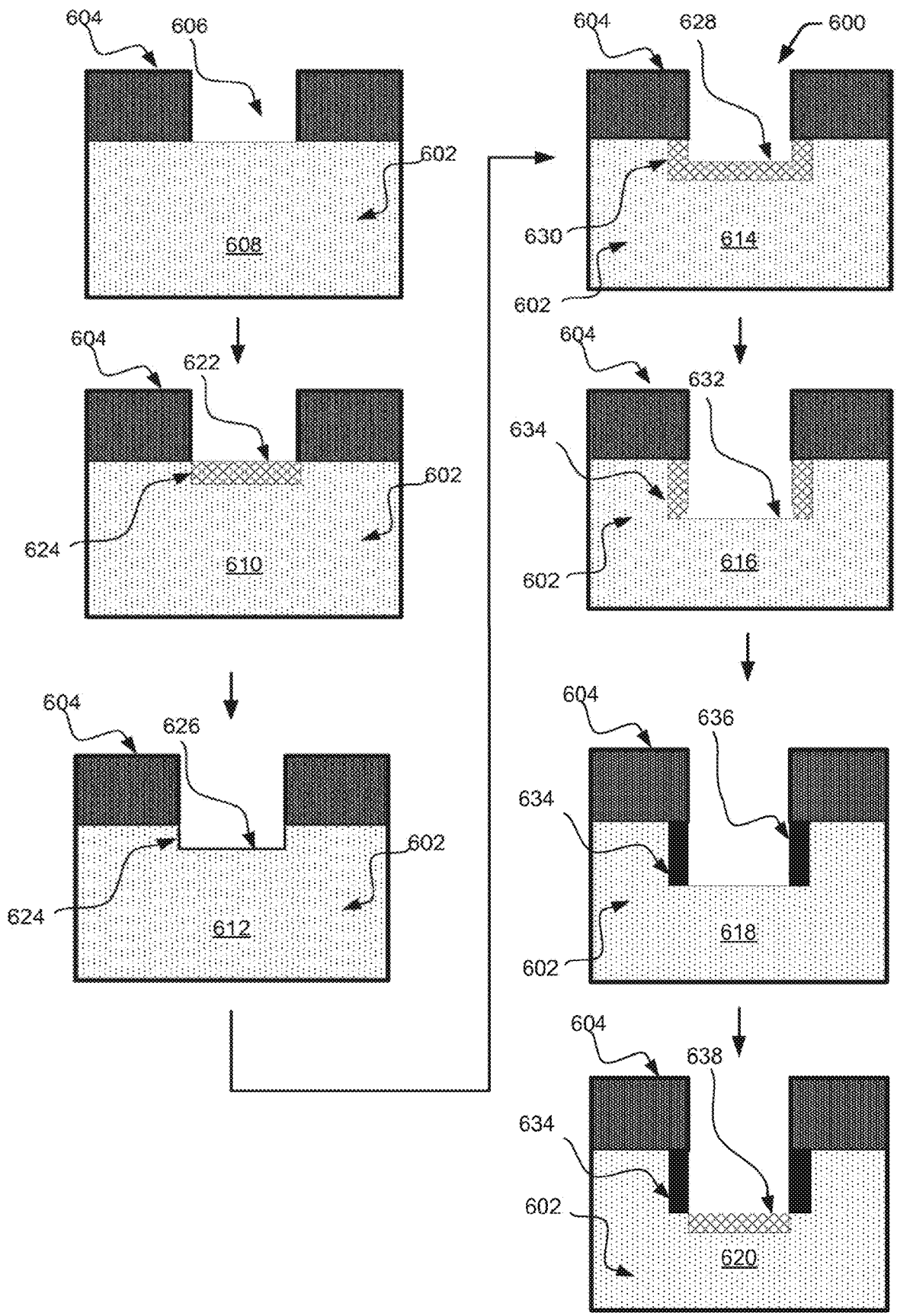
FIG. 5 is an illustration of an embodiment of a substrate being exposed to successive plasma treatments that remove monolayers from portions of the substrate and being exposed to a silylating agent.

FIG. 5 is an illustration of a sequence 600 of a patterned substrate 602 being treated with alternating plasma treatments that may remove monolayers from portions of the patterned substrate 602, and a silylating step after the carbonized layer is formed. In most embodiments, the patterned substrate 602 includes sidewalls or trenches that protrude from or into the substrate 602. The sequence 600 begins in the upper left corner of FIG. 5 with the patterned substrate 602 that may include an overlying layer 604, such as a patterned mask layer, and a first exposed portion 606 of the patterned substrate 602. Sequence steps 608-620 illustrate one exposure sequence and steps may be added or omitted to achieve a desired result.

The patterning method for substrate 602 is omitted for ease of illustration. FIG. 5 shows one portion of the patterned substrate 602, but this pattern or other patterns may be incorporated across the patterned substrate 602. In other embodiments, the pattern and exposed portions may vary in size and structure that may include complex patterns for device electrical isolation features and transistor structures (e.g., gate), or memory structures.

At embodiment 610, the first plasma treatment may be used to form the first activated layer 622 at the first exposed portion 606. The first plasma may be tuned to limit the horizontal growth of the first activated layer 622, such that the activation of the first exposed portion 606 increases more quickly perpendicularly to the surface of the substrate 602, than horizontally. For example, this result may be achieved by using oxygen-lean process gas described above. In addition if there is a second plasma step which has preceded this plasma step, the surface at the end of the second plasma step is partly activated by the bombarding ions and these preferentially strike the bottom of the trench and are shielded by the mask 604. In this way, the first activated layer 622 may minimally protrude under the overlying layer 604. The first activated layer 622 may also be conformally formed on the structure protruding from or into the substrate 602. As described above, the first plasma may be cycled to a second plasma to remove the first activated layer 622 to expose a second portion 626 of the substrate 602.

Embodiment 612 illustrates the second exposed portion 626 of the substrate 602 following the removal of the activated layer 622. The second exposed portion 626 may be a carbonized layer. The second exposed portion 626 may include a sidewall thickness 624 and a width similar to the first activated layer 622 due to the self-limiting aspect of the volatilization. The second exposed portion 626 may be relatively conformal to the geometry of the first activated layer 622 due to the relatively high etch selectivity between the first activated layer 622 and the substrate 602 (which may be carbonized). The second exposed portion 626 may include a sidewall and a bottom wall that may be exposed to subsequent processing that may remove additional monolayers from the substrate 602. Following the removal of the first activated layer 622 the process may then return to an activating process that may activate the second exposed portion 626.

Embodiment 614 illustrates the results of activating the second exposed portion 626 of the substrate 602. The activation process may be limited to depositing or oxidizing a new monolayer(s) along the bottom wall, or may include sidewalls of the second exposed portion 626. In one embodiment, the second activated layer 628 may form in a horizontal and vertical direction using one or more of the embodiments disclosed herein. The process may be self-limiting based on controlling the activation rate via one or more process conditions (e.g., pressure, etc.) disclosed herein that may make it less likely that activating species (e.g., radicals) to contact the sidewall. The processing conditions of the second activation process may be varied to form a desired sidewall thickness 630 that may or may not be the same thickness as the bottom portion of the second activated layer 628. In this way, the trench may extend further down into the substrate 602 instead of expanding sideways into the substrate 602.

Embodiment 616 shows the result of exposing the second activated layer 628 to the second plasma that may be tuned to selectively remove a lower amount of the sidewall relative to the amount of the second activated layer 628 that may be removed at the bottom of the trench. In this way, the third exposed portion 632 may be formed, such that the bottom wall may expose the substrate 602 but the sidewall may not have exposed the substrate 602. In one embodiment, the selective removal of the bottom of the trench may be accomplished by tuning the direction of the volatilizing ions in the second plasma so that they are less likely to interact with or etch the sidewall than the bottom of the trench. Thus, the width 634 of the activated sidewall after this volatilizing step may be the same or substantially the same as the width 630 of the activated sidewall in the preceding activating step.

Embodiment 618 illustrates the result of exposing the substrate 602 to a silylating agent. The sidewalls may contain activated moieties that reacted with the silylating agent thereby forming silylated sidewalls 636. As the width 634 of the silylated sidewall 636 may be the same or substantially the same as the width 634 of the activated sidewall in the preceding step, both widths are referred to by the same numerals. The bottom of the trench may be devoid of such activated moieties following the removal of the second activated layer 628 thus the bottom of the trench does not react with the silylating agent.

Embodiment 620 illustrates the result of exposing the substrate to a first plasma thereby forming a third activated layer 638. In certain embodiments the reactive species of the first plasma is a radical of oxygen and such oxygen radicals oxidize the silylated sidewalls to form a glass like material of inert passivating $SiO_2$ that is resistant to further oxidation. Since this silylation does not occur at the bottom of the feature, the activation and volitalization of the feature bottom is not impeded. The third activated layer 638 may include a few more monolayers formed at the bottom of the trench while maintaining the sidewall thickness 634. As a result, local uniformity is achieved. In other embodiments, the activation/volatilization process is applied to other structures and thus is not limited to the embodiment illustrated in FIG. 5.

Figure 6:
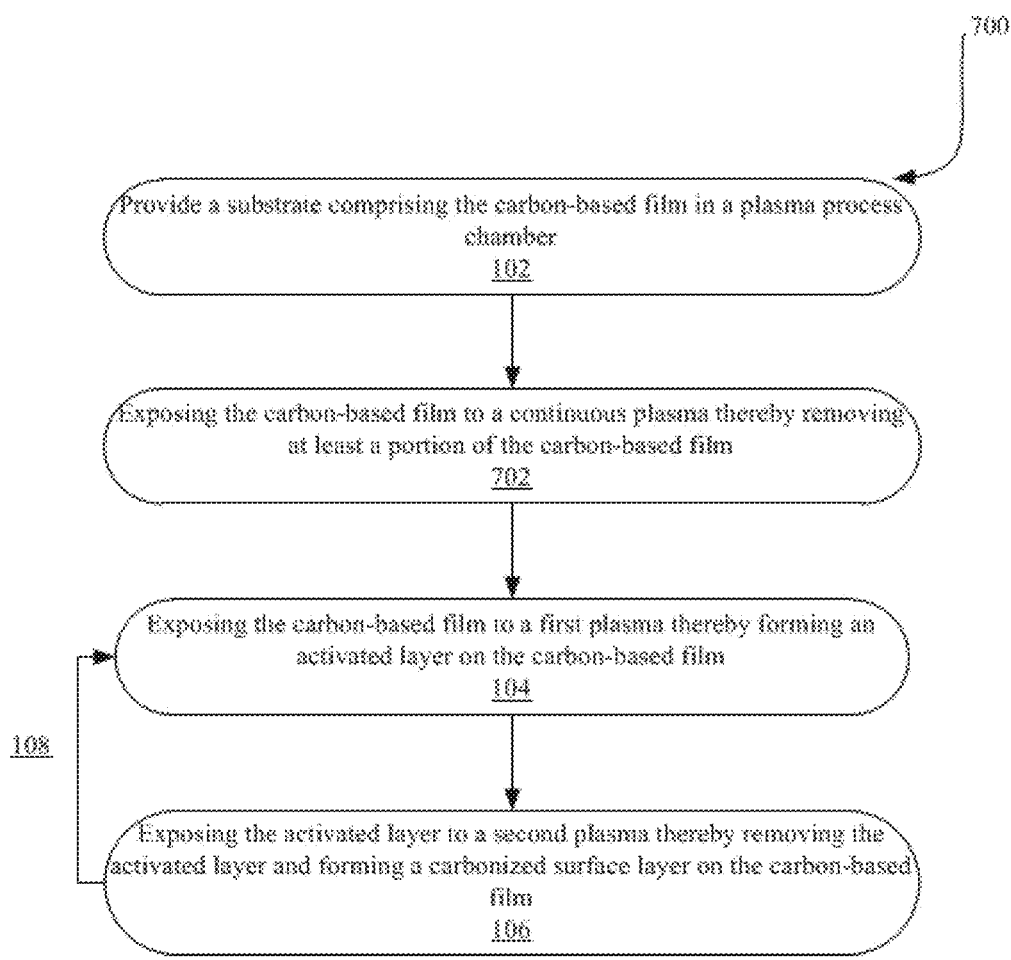
FIG. 6 is a flow diagram for an embodiment of the cyclic etch method which includes exposing the substrate to a continuous plasma before the exposure to the first plasma.

FIG. 6 shows an embodiment 700 of the cyclic etch method which further includes exposing the substrate to a continuous plasma in block 702 before the exposure to the first plasma to take advantage of the high throughput associated with continuous etching and the uniformity associated with the cyclic etching. The continuous plasma may differ from the first and second plasma in terms of the oxygen content, ion flux, and/or the duration of the plasma. The continuous plasma may be generated by plasma-exciting a process gas which is lean in the activating gas. The reactor pressure may, for example, be between 5-1,000 mTorr, 40-500 mTorr, or 100-300 mTorr. A reactor pressure for the continuous plasma may be not more than 60%, 50%, 40%, 30%, or 20% of the reactor pressure for the first plasma. In some embodiments where the energy source is microwave, a power between 500-10,000 W, or 1,000-3,000 W may be applied at a driving frequency between 300 MHz to 10 GHz, or about 2.45 GHz to a source electrode disposed in the plasma reactor. In some embodiments where the energy source is radiofrequency, a power between 1-300 W, 5-100 W, or 10-50 W may be applied. In some embodiments, the process gas may contain no more than 5 vol %, 4 vol %, 3 vol %, or between 1-2 vol % of $O_2$ gas in a dilution gas. Preferably, the dilution gas is Ar gas. The substrate may be exposed to the continuous plasma for 1-120 s, 10-110 s, 30-80 s, or 50-70 s. A combination of the cyclic etch process and the continuous etch process may improve the profile control of the etched structures. For example, the global vertical etch rate non-uniformity and/or an ARDE of a carbon-based film etched using this method may be between 1-5%, 1.5-4%, or 2-3%, and/or 0.5-3 magnitudes, 0.8-2 magnitudes, or about 1 magnitude smaller than the corresponding values for a carbon-based film etched with only a continuous wave plasma.

Example 1 Placement of Sample Coupons

Figure 7:
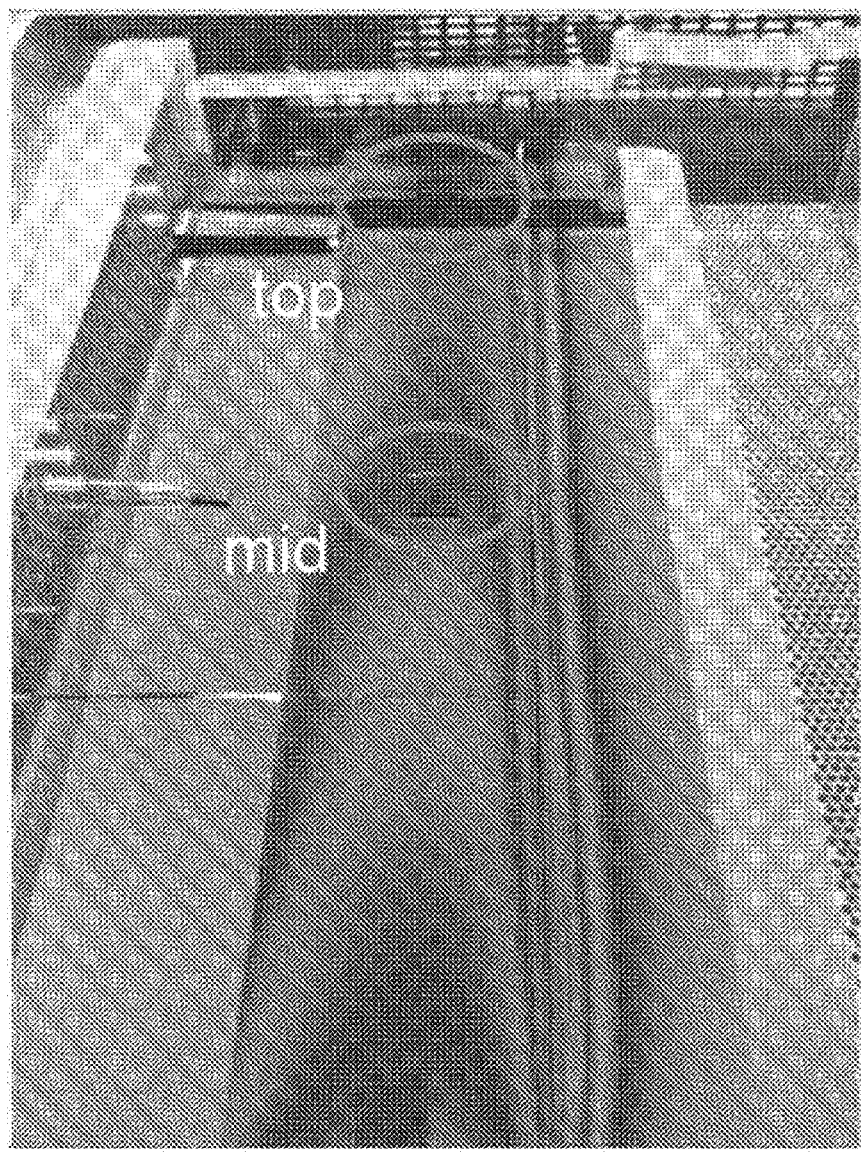
FIG. 7 is a photograph that shows placement of a pair of sample coupons in a horizontal test bed plasma reactor according to an embodiment of the disclosure.

FIG. 7 is a photograph that shows placement of a pair of sample coupons in a horizontal test bed plasma reactor according to an embodiment of the disclosure. The plasma reactor had significantly different plasma and neutral species densities for the different sections of the plasma reactor. The figure shows a first sample coupon in a top section near one edge of the plasma reactor and a second sample coupon in a mid-section near the middle of the plasma reactor. In this test bed reactor which has a rectangular shape, the plasma was approximately uniform through the middle of the reactor but fell off at the two ends which were bounded by quartz walls. The first sample coupon was placed near one of these quartz walls and so it received less ion bombardment than the second sample coupon placed in the mid-section. The sample coupons contained a trilayer mask pattern with layers of photoresist and silicon-containing anti-reflective coating (SiARC) overlying an organic polymer layer (OPL) which was a carbon-based material.

Example 2 Comparative Example

Figure 8A:
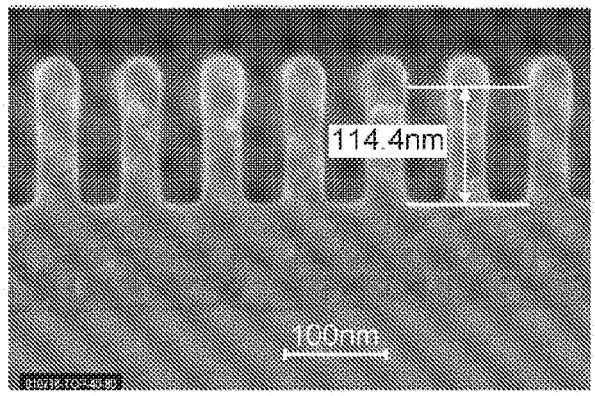
FIG. 8A is a cross-sectional SEM image showing dense lines in the coupon labeled "top" etched with a continuous wave plasma.
Figure 8B:
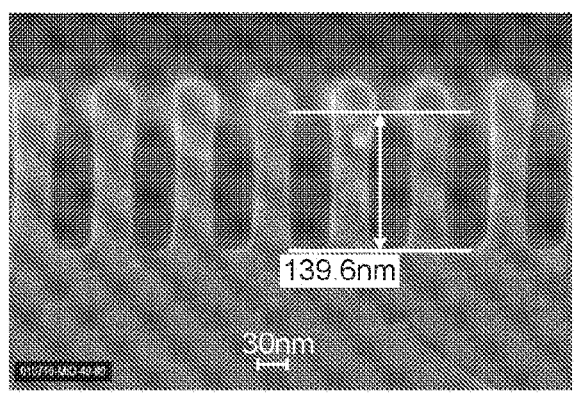
FIG. 8B is a cross-sectional SEM image showing dense lines in the coupon labeled "mid" etched with a continuous wave plasma.
Figure 8C:
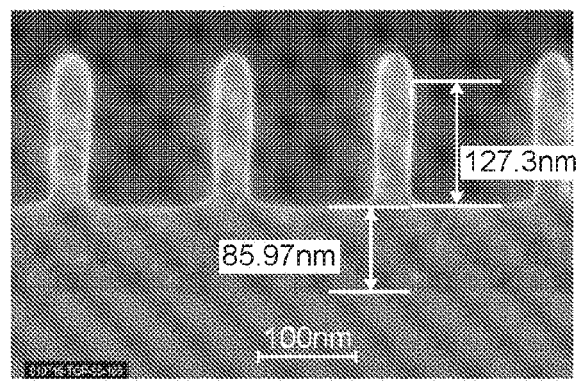
FIG. 8C is a cross-sectional SEM image showing isolated lines in the coupon labeled "top" etched with a continuous wave plasma.
Figure 8D:
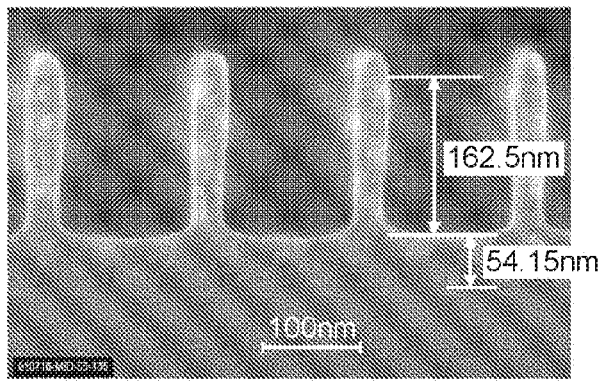
FIG. 8D is a cross-sectional SEM image showing isolated lines in the coupon labeled "mid" etched with a continuous wave pattern.

FIGS. 8A-8D show cross-sectional scanning electron microscopy (SEM) images for etched sample coupons. The OPL was etched using the photoresist/SiARC as a mask in a continuous etch mode using Ar/$O_2$ gas flows of 300/2 sccm, plasma power of 100 W at 13 MHz, gas pressure of 60 mTorr, and an exposure time of 125 s. FIGS. 8A and 8B show cross-sectional SEM images for dense lines on the first and second coupons. In all micrographs, the SiARC masks overlay the dense/isolated lines. The OPL etch depths were 114.4 nm/139.6 nm in the first/second coupons, respectively. FIGS. 8C and 8D show cross-sectional SEM images from isolated lines on the first and second coupons. The OPL etch depths were 127.3 nm/162.5 nm in the first/second coupons, respectively. The results in FIGS. 8A-8D show a global vertical etch rate non-uniformity (CDU) of about 20% for the dense lines and about 24% for the isolated lines. An ARDE of about 15% was found at the middle coupon location and about 10% for the top coupon. The global vertical etch rate non-uniformity was calculated from the depths of the nested features for the middle and top coupons. The ARDE was calculated using the etch depths of the nested and isolated lines for the middle coupon. Over the course of research, the average global vertical etch rate non-uniformity was found to be about 20% and the average ARDE was found to be about 15%. FIGS. 8A-8D provide one example used for calculating the average values.

Example 3 Inventive Example

FIGS. 9A-9D show cross-sectional SEM images for etched sample coupons according to an embodiment of the disclosure. The OPL was etched using the photoresist/SiARC as a mask in a cyclic etch process where an etch cycle was carried out a plurality of times The complete etch consisted of 65 steps each of which consisted of the following substeps: 1) plasma exposure using a process gas consisting of 300 sccm of $O_2$ gas, plasma power of 15 W, gas pressure of 200 mTorr, exposure time of 0.5 s; 2) a vacuum purge step; 3) plasma exposure using a process gas consisting of 300 sccm of Ar gas, plasma power of 100 W, gas pressure of 60 mTorr, exposure time of 1 s; and 4) a vacuum purge step. The purges were interspersed so that oxygen was not present in the plasma reactor during step 3).

Figure 9A:
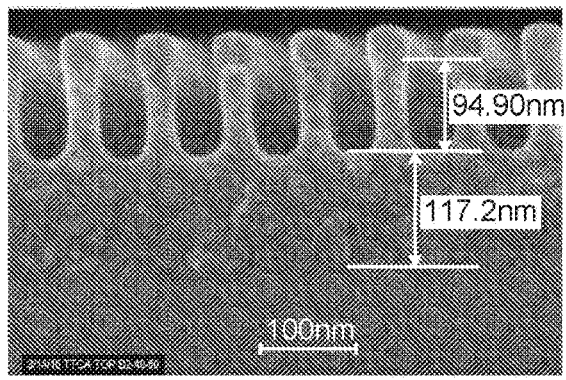
FIG. 9A is a cross-sectional scanning electron microscopy (SEM) image showing dense lines in a the coupon labeled "top" etched with an embodiment of the disclosed cyclic etch method cyclic process.
Figure 9B:
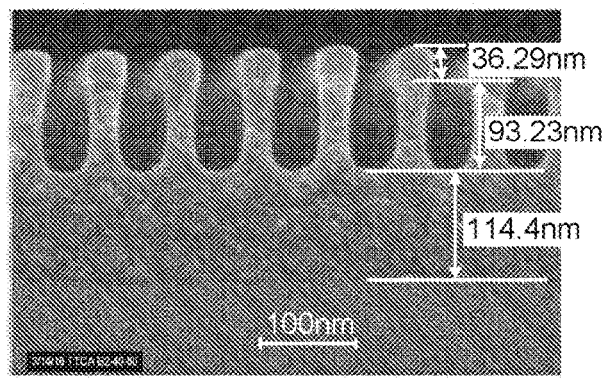
FIG. 9B is a cross-sectional SEM image showing dense lines in the e coupon labeled 'mid' etched with an embodiment of the disclosed cyclic etch method.
Figure 9C:
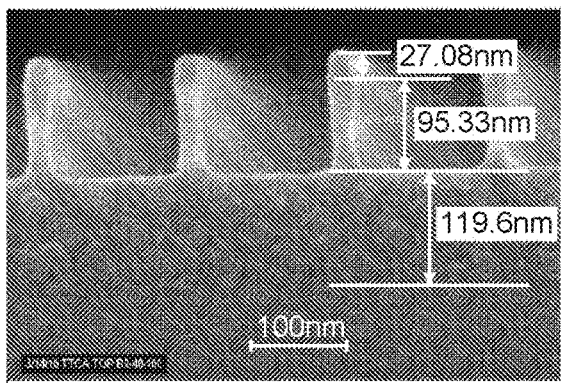
FIG. 9C is a cross-sectional SEM image showing isolated lines in the coupon labeled "top" etched with an embodiment of the disclosed cyclic etch method.
Figure 9D:
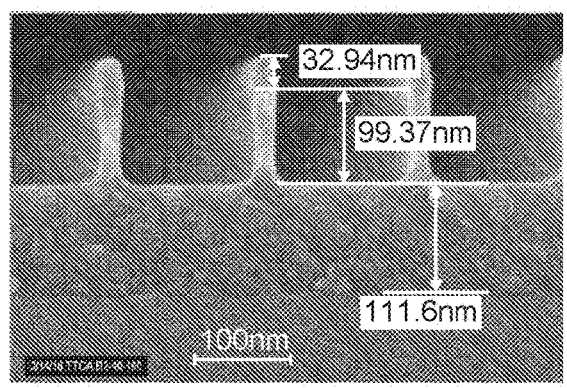
FIG. 9D is a cross-sectional SEM image showing isolated lines in the coupon labeled "mid" etched with an embodiment of the disclosed cyclic etch method.

FIGS. 9A and 9B show cross-sectional SEM images for dense lines on the first and second coupons. The OPL etch depths were 94.90 nm/93.23 nm in the first/second coupons, respectively. FIGS. 9C and 9D show cross-sectional SEM images from isolated lines in the first and second coupons. The OPL etch depths were 95.33 nm/99.37 nm in the first/second coupons, respectively. The results in FIGS. 9A-9D show a global vertical etch rate non-uniformity of about 1.7% for the dense lines and about 4% for the isolated lines. An ARDE of about 6% was found at the middle coupon location and about 1% at the top coupon location. Over the course of research, the average global vertical etch rate non-uniformity was found to be about 2% and the average ARDE was found to be about 1%. FIGS. 9A-9D provide one example used for calculating the average values.

Figure 10:
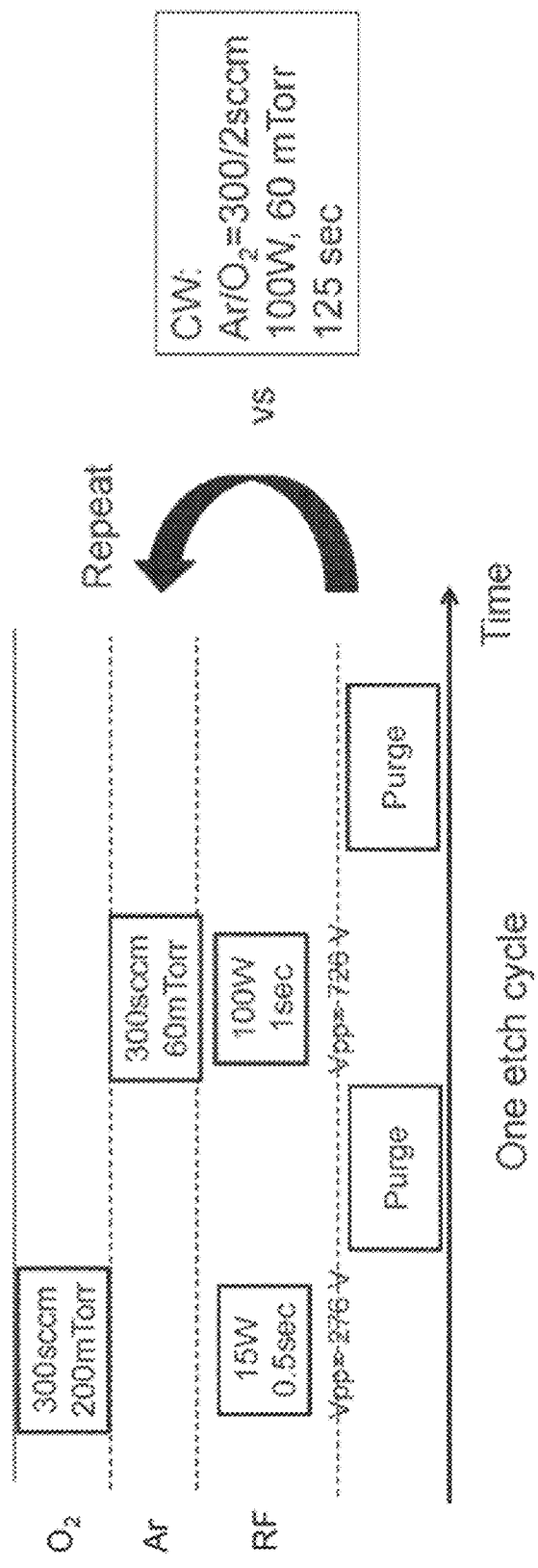
FIG. 10 schematically shows exemplary plasma etch parameters for a continuous plasma etch and a cyclic etch according to an embodiment of the disclosure.

FIG. 10 schematically shows exemplary plasma etch parameters for the continuous plasma etch and a cyclic etch method described above in FIGS. 9A-9D and 10A-10D.

A comparison of the continuous etch process in FIGS. 9A-9D and the disclosed cyclic etch process in FIGS. 10A-10D shows that the global vertical etch rate uniformity improved from about 20% to about 2% and the ARDE improved from about 15% to about 1% in the cyclic etch process. These are remarkable improvements in the global vertical etch rate uniformity and the ARDE and the results were repeated in other experiments. It is contemplated that these great improvements were due to the self-limiting nature of both the oxidation step (step 1) and the volatilization step (step 3) in the cyclic etch process.

The OES-"SIMS" analysis method showed that this self-limitation occurred both in the $O_2$ plasma exposure step and in the Ar plasma exposure step. The cyclic scheme broke the overall etch process into two fundamental steps: an oxidation step in which oxygen moieties were introduced into the polymer matrix from the oxidizing plasma; and a volatilization step in which the oxidized moieties were detached from the polymer matrix by the non-oxidizing inert gas plasma. More particularly, the oxidizing (e.g., $O_2$) plasma exposure step formed an oxidized layer on the surface of the OPL, and the non-oxidizing inert gas plasma (i.e., Ar sputtering) volatilized the oxidized layer and then rapidly created a carbonized, hydrogen-depleted layer which had a low Ar plasma etch rate following its initial formation. The carbonized surface layer was formed by conversion of the exposed carbon-based film into a carbon layer or a carbon-containing residue. The self-limitation in the Ar plasma exposure step was due to the low etch rate of the formed carbonized surface layer and the finite range of the argon ions penetration into the polymer. The range depended only on the ion energy and not on the ion total fluence. In the oxidation plasma exposure step, the high density of the carbonized layer prevented the diffusion of oxidizing species into the polymer interior before the oxidizing species was extinguished, for example in the case of oxygen atoms by recombining with another oxygen atom. This leads to an oxygen-saturated carbonized layer. It may also possible that the argon ion bombardment left the upper dense carbonized layer in a chemically reactive state with unsatisfied bonds. This layer then oxidized more rapidly than the underlying polymer. At this time there is no independent evidence available to either confirm or disprove this.

The relative amount of $O_2$ in an $O_2$/Ar mixture may be adjusted to affect the vertical profiles of the etched recessed features in a carbon-based film. In particular, the use of a lean $O_2$/Ar mixture enhanced redeposition of carbon-based etch by-products on sidewalls of the etched features and thus improved the vertical profiles. However, too lean $O_2$/Ar mixtures rapidly eroded SiARC masks. In continuous plasmas, rich $O_2$/Ar mixtures combusted the carbon-based etch by-products in the gas phase, thus preventing them from redepositing on the sidewalls and improving the vertical profile. In contrast, in the cyclic scheme most etch by-products were produced in the argon sputter step when there was no oxygen present to combust the etch by-products in the gas phase. This improved the etch profiles when a rich process gas mixture was used in the oxidation step.

The plasma etch process may include alternating sequences of the cyclic etch process described above and the addition of an $O_2$-lean continuous etch process at low pressure that utilizes, for example, 1-2% $O_2$ gas in Ar gas. The combination of the cyclic etch process and the continuous etch process was found to improve profile control of the etched structures.

Example 4 Mechanism Studies of Plasma Etching

Figure 11:
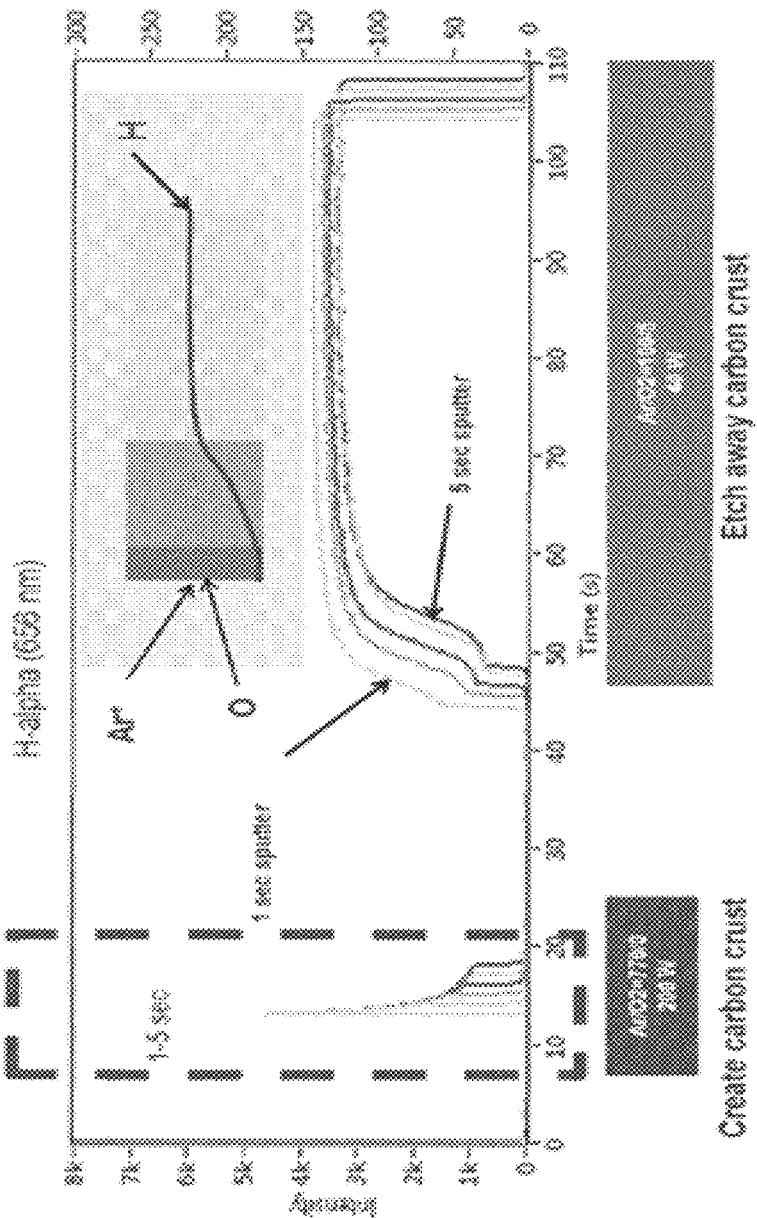
FIG. 11 schematically shows mechanism studies using the OES-"SIMS" method according to an embodiment of the disclosure.

FIG. 11 schematically shows mechanism studies using the OES-"SIMS" method. OES signals at 656 nm (H-alpha) from hydrogen released from an organic film were monitored and analyzed during cyclic plasma etching. The figure shows OES signals for 1-5 sec Ar plasma etch that created carbonized layer with different thicknesses on a carbon-based film and an Ar/$O_2$ plasma exposure that etched the carbonized layer. The initial OES signals during the Ar/$O_2$ plasma exposure show the difference in thickness of the different oxidized layers. This enabled in-line real-time metrology for analyzing the surface composition with nm accuracy during the etching.

Using this technique, it was discovered that each of the oxygen exposure steps and argon exposure steps create layers on the wafers with a self-limiting character. The cyclic alternating argon/oxygen plasma exposures were unexpectedly self-limiting even though some oxygen plasma exposures were not self-limiting at all. The argon ion exposure removed the oxidized moieties from the surface of an oxygen saturated carbon crust layer (oxidation layer) by rapid sputtering of the layer, then once past the activated layer, the argon ions created a renewed carbon crust layer (carbonized surface layer) by preferentially removing the hydrogen from the hydrocarbon polymer. The argon ion etch rate of the carbon crust layer was low since the carbon crust layer is denser than the remaining underlying carbon-based layer.

It is to be appreciated that the detailed description section, and not the abstract section, is intended to be used to interpret the claims. The abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. The disclosure in its broader aspects is therefore not limited to the details, representative apparatus and method and illustrative examples shown and described. Accordingly, departures may be made from such details without departing from the scope of the general inventive concept.

The invention claimed is:

1. A cyclic etch method for etching a carbon-based film, the method comprising:
   providing a substrate comprising the carbon-based film;
   exposing a first exposed surface of the carbon-based film to a first process gas that includes a first plasma, thereby forming a first activated layer starting from the first exposed surface of the carbon-based film to a first depth below the first exposed surface of the carbon-based film;
   exposing the first activated layer to a second process gas comprising a second plasma, thereby removing the first activated layer and forming, as a first carbonized layer, a second exposed surface of the carbon-based film, wherein the removal of the first activated layer etches the carbon-based film by an amount corresponding to the first depth below the first exposed surface of the carbon-based film to form the second exposed surface of the carbon-based film, wherein the second process gas is a non-activating inert gas;
   exposing the second exposed surface of the carbon-based film to the first process gas that includes the first plasma, thereby forming a second activated layer starting from the second exposed surface of the carbon-based film to a second depth below the second exposed surface of the carbon-based film; and
   exposing the second activated layer to the second process gas comprising the second plasma, thereby removing the second activated layer and forming, as a second carbonized layer, a third exposed surface of the carbon-based film, wherein the removal of the second activated layer etches the carbon-based film by an amount corresponding to the second depth below the second exposed surface of the carbon-based film to form the third exposed surface of the carbon-based film,
   wherein a frequency power of the first plasma is greater than a frequency power of the second plasma,
   wherein a first duration for exposing the first and second activated layers to the second process gas is longer than a second duration for exposing the first and second exposed surfaces of the carbon-based film to the first process gas.

2. The method of claim 1, wherein the first process gas comprises the first plasma formed by plasma-exciting a process gas consisting of $O_2$ gas.

3. The method of claim 1, wherein the first process gas comprises the first plasma formed by plasma-exciting a process gas consisting of $O_2$ gas and an inert gas.

4. The method of claim 1, wherein the first process gas comprises the first plasma formed by plasma-exciting a process gas comprising $O_2$ gas and Ar gas.

5. The method of claim 1, wherein the second process gas comprises the second plasma formed by plasma-exciting a process gas consisting of Ar gas.

6. The method of claim 1, wherein the carbon-based film comprises at least one of a hydrocarbon polymer and an amorphous hydrogenated carbon.

7. The method of claim 1, wherein the carbon-based film comprises carbon and hydrogen, and the first and second carbonized layers are depleted of hydrogen relative to the carbon-based film of the substrate.

8. The method of claim 1, wherein a patterned mask layer overlies the carbon-based film.

9. The method of claim 8, wherein the patterned mask layer comprises:
   an anti-reflective coating comprising silicon, wherein the anti-reflective coating is on the carbon-based film; and
   a photoresist layer on the anti-reflective coating.

10. The method of claim 1, wherein the formation of the first and second activated layers and the formation of the first and second carbonized layers are self-limiting processes.

11. The method of claim 1, wherein the carbon-based film comprises carbon and hydrogen, the method further comprising:
   monitoring light emission from by-products released from the carbon-based film to determine properties of the first and second carbonized layers, the first and second activated layers, or both the first and second carbonized layers and the first and second activated layers.

12. The method of claim 11, wherein the properties of the first and second carbonized layers include a thickness of the first and second carbonized layers.

13. The method of claim 11, wherein the properties of the first and second activated layers include a thickness of the first and second activated layers.

14. The method of claim 1, further comprising exposing the first and second activated layers to a silylating agent thereby adding silicon to the first and second activated layers.

15. The method of claim 14, wherein the silylating agent comprises hexamethyldisilazane.

16. The method of claim 1, further comprising exposing the first and second carbonized layers to a silylating agent thereby adding silicon to the first and second carbonized layers.

17. The method of claim 16, wherein the silylating agent comprises hexamethyldisilazane.

18. The method of claim 1, further comprising exposing the carbon-based film to a continuous plasma to remove the carbon-based film by a non-self-limiting process, wherein the continuous plasma is formed by plasma-exciting a process gas comprising $O_2$ gas and Ar gas.

19. The method of claim 18, further comprising varying relative amounts of $O_2$ and Ar gas in the continuous plasma.

20. The method of claim 1, wherein the first duration is in a range from 0.5 seconds to 10 seconds, and the second duration is in the range of 0.5 seconds to 10 seconds.

21. The method of claim 20, wherein a sum of the first duration and the second duration is less than or equal to 20 seconds.

22. The method of claim 1, wherein the first duration for exposing the first and second activated layers to the second process gas is 1.5 to 4 times longer than the second duration for exposing the first and second exposed surfaces of the carbon-based film to the first process gas.

\* \* \* \* \*